United States Patent
Lin et al.

(10) Patent No.: US 10,396,166 B2
(45) Date of Patent: Aug. 27, 2019

(54) SEMICONDUCTOR DEVICE CAPABLE OF HIGH-VOLTAGE OPERATION

(71) Applicant: MEDIATEK INC., Hsin-Chu (TW)

(72) Inventors: Cheng Hua Lin, Hsinchu (TW); Yan-Liang Ji, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/425,207

(22) Filed: Feb. 6, 2017

(65) Prior Publication Data

US 2017/0263717 A1 Sep. 14, 2017

Related U.S. Application Data

(60) Provisional application No. 62/382,804, filed on Sep. 2, 2016, provisional application No. 62/306,661, filed on Mar. 11, 2016.

(51) Int. Cl.
*H01L 29/40* (2006.01)
*H01L 29/10* (2006.01)
(Continued)

(52) U.S. Cl.
CPC ........ *H01L 29/404* (2013.01); *H01L 29/1095* (2013.01); *H01L 29/401* (2013.01);
(Continued)

(58) Field of Classification Search
None
See application file for complete search history.

(56) References Cited

U.S. PATENT DOCUMENTS

| 4,811,078 A | 3/1989 | Tigelaar et al. |
| 5,393,691 A | 2/1995 | Hsu et al. |
| (Continued) | | |

FOREIGN PATENT DOCUMENTS

| CN | 102569079 B | 12/2014 |
| JP | H09237841 A | 9/1997 |
| WO | WO 2012/147456 A1 | 11/2012 |

OTHER PUBLICATIONS

U.S. Appl. No. 15/411,099, filed Jan. 20, 2017, Lin et al.
U.S. Appl. No. 15/426,414, filed Feb. 7, 2017, Hu et al.
U.S. Appl. No. 16/225,077, filed Dec. 19, 2018, Lin et al.

*Primary Examiner* — Abul Kalam
(74) *Attorney, Agent, or Firm* — Wolf, Greenfield & Sacks, P.C.

(57) ABSTRACT

A semiconductor device capable of high-voltage operation includes a semiconductor substrate having a first conductivity type. A first well doped region is formed in a portion of the semiconductor substrate. The first well doped region has a second conductivity type. A first doped region is formed on the first well doped region, having the second conductivity type. A second doped region is formed on the first well doped region and is separated from the first doped region, having the second conductivity type. A first gate structure is formed over the first well doped region and is adjacent to the first doped region. A second gate structure is formed beside the first gate structure and is close to the second doped region. A third gate structure is formed overlapping a portion of the first gate structure and a first portion of the second gate structure.

25 Claims, 8 Drawing Sheets

(51) Int. Cl.
  *H01L 29/66* (2006.01)
  *H01L 29/78* (2006.01)
(52) U.S. Cl.
  CPC ...... *H01L 29/402* (2013.01); *H01L 29/66681* (2013.01); *H01L 29/7816* (2013.01); *H01L 29/1083* (2013.01); *H01L 29/7831* (2013.01)

(56) References Cited

U.S. PATENT DOCUMENTS

| | | | |
|---|---|---|---|
| 6,448,611 | B1 | 9/2002 | Oh |
| 6,710,416 | B1 | 3/2004 | Xu |
| 6,825,531 | B1 | 11/2004 | Mallikarjunaswamy |
| 9,761,657 | B2 * | 9/2017 | Hsiao ............... H01L 29/0638 |
| 10,199,496 | B2 | 2/2019 | Lin et al. |
| 2004/0021182 | A1 | 2/2004 | Green et al. |
| 2005/0253167 | A1 | 11/2005 | Wu et al. |
| 2005/0253168 | A1 | 11/2005 | Wu et al. |
| 2007/0007591 | A1 * | 1/2007 | Theeuwen ......... H01L 29/0847 257/340 |
| 2007/0096205 | A1 | 5/2007 | Ko et al. |
| 2008/0014690 | A1 | 1/2008 | Chu et al. |
| 2008/0070371 | A1 | 3/2008 | Wang |
| 2011/0260247 | A1 * | 10/2011 | Yang ................. H01L 29/0653 257/343 |
| 2012/0068772 | A1 | 3/2012 | Murad et al. |
| 2012/0126323 | A1 | 5/2012 | Wu et al. |
| 2012/0211832 | A1 * | 8/2012 | Chu ..................... H01L 29/402 257/335 |
| 2013/0020632 | A1 | 1/2013 | Disney |
| 2013/0146973 | A1 * | 6/2013 | Mitra ................. H01L 29/7835 257/335 |
| 2013/0320432 | A1 * | 12/2013 | Ng ................. H01L 21/823487 257/329 |
| 2014/0167171 | A1 * | 6/2014 | Kaya .................... H01L 29/404 257/367 |
| 2015/0123199 | A1 * | 5/2015 | Chen ................. H01L 29/66681 257/339 |
| 2015/0194494 | A1 | 7/2015 | Ahn et al. |
| 2015/0236150 | A1 | 8/2015 | Chen et al. |
| 2016/0093729 | A1 * | 3/2016 | Wang ................... H01L 29/402 257/339 |
| 2016/0172490 | A1 | 6/2016 | Lao et al. |
| 2017/0077250 | A1 * | 3/2017 | Hsiao ................. H01L 29/4232 |
| 2017/0077293 | A1 * | 3/2017 | Chien ................. H01L 29/7816 |
| 2017/0110536 | A1 * | 4/2017 | Hsiao ................. G06F 17/5072 |
| 2017/0229570 | A1 * | 8/2017 | Cheng ................... H01L 29/785 |
| 2017/0263717 | A1 | 9/2017 | Lin et al. |
| 2017/0263761 | A1 | 9/2017 | Hu et al. |
| 2017/0263764 | A1 | 9/2017 | Lin et al. |

* cited by examiner

SEMICONDUCTOR DEVICE CAPABLE OF HIGH-VOLTAGE OPERATION

CROSS REFERENCE TO RELATED APPLICATIONS

This application claims the benefit of U.S. Provisional Application No. 62/306,661 filed Mar. 11, 2016 and U.S. Provisional Application No. 62/382,804 filed on Sep. 2, 2016 the entirety of which are incorporated by reference herein.

BACKGROUND OF THE INVENTION

Field of the Invention

The present invention relates to integrated circuits (ICs), and in particular to semiconductor devices capable of high-voltage operation.

Description of the Related Art

Recently, as demand has increased for high-voltage devices such as power semiconductor devices, there has been an increasing interest in research on high-voltage metal-oxide-semiconductor field effect transistors (HV MOSFETs) applied in high-voltage devices.

Among the various types of high-voltage metal-oxide-semiconductor field effect transistors (HV MOSFETs), semiconductor devices such as lateral double diffused metal-oxide-semiconductor (LDMOS) devices are often used.

However, with progress being made in semiconductor fabrication, the breakdown voltage of high-voltage MOSFETs for high-voltage devices needs to be increased further. Thus, a reliable high-voltage MOSFET for high-voltage devices having an increased breakdown voltage is needed to meet device performance requirements as the needs in semiconductor fabrication of high-voltage devices continue.

BRIEF SUMMARY OF THE INVENTION

An exemplary embodiment of a semiconductor device is provided. The semiconductor device includes a semiconductor substrate having a first conductivity type. A first well doped region is formed in a portion of the semiconductor substrate. The first well doped region has a second conductivity type that is the opposite of the first conductivity type. A first doped region is formed on the first well doped region, having the second conductivity type. A second doped region is formed on the first well doped region and is separated from the first doped region, having the second conductivity type. A first gate structure is formed over the first well doped region and is adjacent to the first doped region. A second gate structure is formed beside the first gate structure and is close to the second doped region. A third gate structure is formed overlapping a portion of the first gate structure and a first portion of the second gate structure.

Another exemplary embodiment of a semiconductor device includes a semiconductor substrate having a first conductivity type. A first well doped region is formed in a portion of the semiconductor substrate. The first well doped region has a second conductivity type that is the opposite of the first conductivity type. A first doped region is formed on the first well doped region, having the second conductivity type. A second doped region is formed on a portion of the first well doped region and separated from the first doped region, having the second conductivity type. A first gate structure is formed on the first well doped region and is close to the first doped region. A second gate structure is positioned close to the second doped region and is separated from the first gate structure. A third gate structure covers the first gate structure and the second gate structure. A first portion of a bottom surface of the third gate structure is in contact with a top surface of the first gate structure. A second portion of the bottom surface of the third gate structure is in contact with a top surface of the second gate structure.

Yet another exemplary embodiment of a semiconductor device includes a semiconductor substrate having a first conductivity type. A first well doped region is formed in a portion of the semiconductor substrate, having a second conductivity type that is the opposite of the first conductivity type. A source doped region is formed on the first well doped region, having the second conductivity type. A drain doped region is formed on the first well doped region and is separated from the first doped region, having the second conductivity type. A gate structure is formed on the first well doped region and is close to the source doped region. A first extended gate structure is formed covering and electrically coupled to the gate structure. A first dummy gate structure covers the first well doped region between the first extended gate structure and the drain doped region, so that the first extended gate structure is pulled away from the drain doped region by the dummy gate structure.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Embodiments provide a semiconductor device. The semiconductor device may include a power metal-oxide-semiconductor (MOS) transistor. The semiconductor device uses both a field plate gate structure and a dummy gate structure to extend a lateral distance between a source doped region and a drain doped region (i.e. a channel length) of the power MOS transistor. The lateral distance is along a direction that is substantially parallel to a top surface of a semiconductor substrate. The field plate gate structure overlaps a portion of a gate structure of the power MOS transistor and electrically connects to the gate structure of the power MOS. The field plate gate structure is composed of a resist-protection-oxide (RPO) pattern and a conductive layer pattern on the RPO pattern. It should be noted that the dummy poly gate structure is disposed laterally between the gate structure and the drain doped region and covered by the field plate gate structure. The dummy gate structure is used to prevent a silicide formed on the top surface of the semiconductor substrate between the field plate gate structure and the drain doped region. Also, the dummy gate structure is electrically floating (i.e. electrically isolated form other components of the power MOS transistor). Therefore, the field plate gate, which is electrically coupled to the gate voltage, can be pulled away from the drain doped region, which is electrically coupled to a high operation voltage. A more uniform electric field contribution can be observed in a channel region (a region between a source doped region and the drain doped region) and a higher breakdown voltage (BVD) is obtained during operations of the of the power MOS transistor. In some embodiments, the dummy poly gate structure and the gate structure may be formed simultaneously (in the same process). Alternatively, the dummy poly gate structure and the field plate gate structure may be formed simultaneously.

FIGS. 1-6 are schematic cross-sectional views showing an intermediate stage of a method for forming a semiconductor device 500a in accordance with some embodiments of the disclosure. The semiconductor device 500a shown in FIG. 6 formed by the method shown in FIGS. 1-6 comprises a high-voltage metal-oxide-semiconductor field effect transistor (HV MOSFET) capable of high-voltage (e.g. 100 volts or above) operations.

Figure 1:
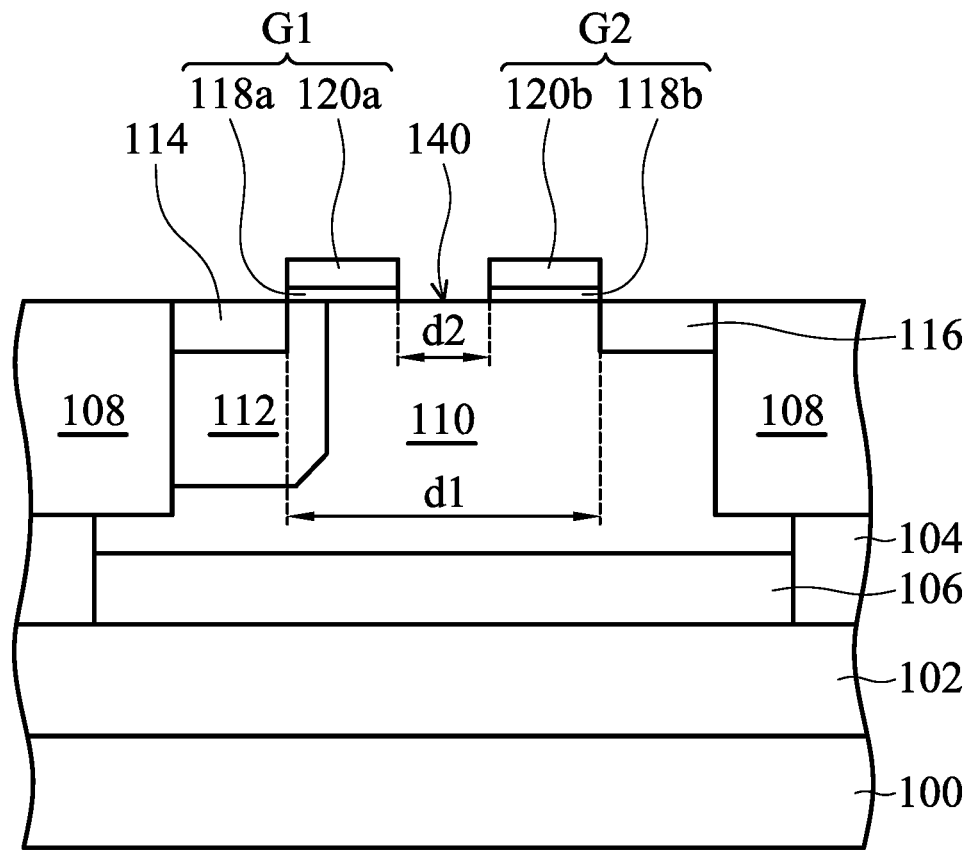
FIGS. 1-6 are schematic cross-sectional views showing an intermediate stage of a method for forming a semiconductor device in accordance with some embodiments of the disclosure.

In FIG. 1, a semiconductor substrate 100 is provided. As shown in FIG. 1, the semiconductor substrate 100 comprises a silicon substrate or a SiGe substrate. In some embodiments, the semiconductor substrate 100 comprises a bulk semiconductor substrate, a strained semiconductor substrate or a compound semiconductor substrate. The semiconductor substrate 100 may have a first conductivity type such as P-type. An isolation element 108 is respectively disposed in opposite end portions of the semiconductor substrate 100 to define an active region for the semiconductor device 500a formed thereon. The isolation elements 108 can be the shallow trench isolation (STI) elements shown in FIG. 1, but are not limited thereto. In some embodiments, the isolation elements 108 can be field oxide (FOX) isolation elements. The isolation elements 108 may comprise insulating materials such as silicon oxides, but they are not limited thereto.

As shown in FIG. 1, a doped buried region 102 is formed in a portion of the semiconductor substrate 100 underlying the isolation elements 108. The doped buried region 102 may have a second conductive type that is the opposite of the first conductivity type, for example N-type. Moreover, a well doped region 104 is formed between the doped buried region 102 and each of the isolation elements 108. A well doped region 106 is formed in a portion of the semiconductor substrate 100 between the well doped regions 104, and is above the doped buried region 102. The well doped regions 104 and the well doped region 106 may have the first conductivity type, for example P-type. A well doped region 110 is formed in the semiconductor substrate 100 between the isolation elements 108, the well doped region 106 and the well doped regions 104. A top surface 140 of the well doped region 110 is also located on the top surface of the semiconductor substrate 100. The well doped region 110 may have the second conductive type, for example N-type. A well doped region 112 is formed on a portion of the well doped region 110 and is adjacent to the one isolation element 108. Also, the well doped region 112 is surrounded by the well doped region 110 and the isolation element 108. The well doped region 112 may have the first conductivity type, for example P-type.

As shown in FIG. 1, a doped region 114 is formed in a portion of the well doped region 112, and may have the second conductivity type, for example N-type. Another doped region 116 is formed in a portion of the well doped region 110, and is adjacent to the right isolation element 108. The doped region 116 may have the second conductivity type, for example N-type. The doped region 114 and the doped region 116 may have a doping concentration greater than that of the well doped region 110. In some embodiments, the doped region 114 and the doped region 116 respectively serve as a source doped region and a drain doped region of the semiconductor device 500a.

A gate structure G1 and a gate structure G2 are formed on the well doped region 110, covering different portions of the well doped region 110. The gate structure G1 is formed over a portion of the well doped region 112 and a portion of the well doped region 110. Also, the gate structure G1 is positioned adjacent to the doped region 114. The gate structure G2 formed over another portion of the well doped region 112, which is close to the drain doped region 116. In this embodiment, the gate structure G2 is disposed adjacent to the drain doped region 116. As shown in FIG. 1, the distance d1 between the doped region 114 and the doped region 116 (i.e. the channel length of the semiconductor device 500a) is greater than the distance d2 between the gate structure G1 and the gate structure G2.

The gate structure G1 comprises a dielectric layer 118a and a conductive layer 120a formed over the dielectric layer 118a. Similarly, the gate structure G2 comprises a dielectric layer 118b and a conductive layer 120b formed over the dielectric layer 118b. In some embodiments, the gate dielectric layers 118a and 118b may comprise silicon oxide, silicon nitride or the like, and may have a thickness of about 23-140 Å. The conductive layers 120a and 120b may comprise conductive materials such as polysilicon, metal or the like, and may have a thickness of about 800-2000 Å. In some embodiments, the gate dielectric layers 118a and 118b are formed simultaneously by a dielectric material deposition process and a subsequent patterning process. The conductive layers 120a and 120b are formed simultaneously by a conductive material deposition process and the subsequent patterning process. Therefore, a top surface of the gate structure G1 is coplanar with a top surface of the gate structure G2.

Figure 2:
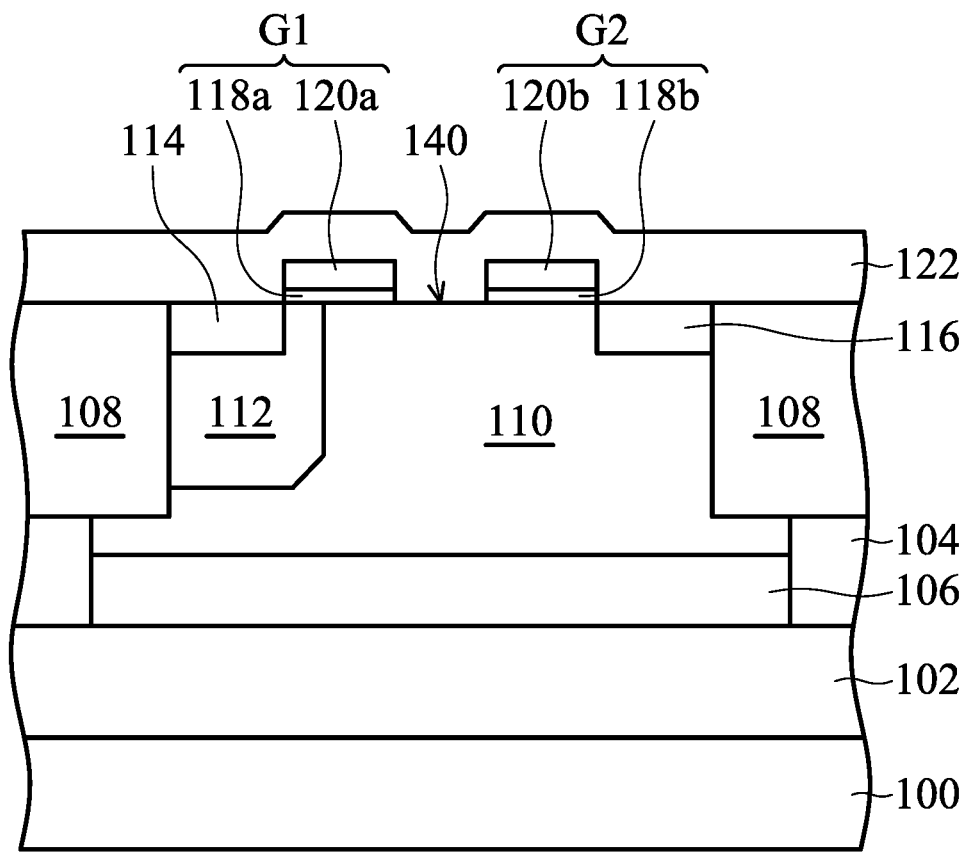

Next, a dielectric layer 122 is conformably and entirely formed on the well doped region 110. The dielectric layer 122 blanketly covers a top surface 140 of the well doped region 110 and the gate structures G1 and G2, as shown in FIG. 2. Also, the dielectric layer 122 is in contact with the gate structure G1 (including the gate dielectric layer 118a and the conductive layer 120a) and the gate structure G2 (including the gate dielectric layer 118b and the conductive layer 120b). In some embodiments, the dielectric layer 122 may comprise silicon oxide, silicon nitride or the like, and may have a thickness of about 200-1200 Å. The dielectric layer 122 may be thicker than the dielectric layers 118a and 118b. In some embodiments, the dielectric layer 122 may serve as a resist-protection-oxide (RPO) layer. The RPO layer is used to cover a silicide-forbidden area of the active region, which avoids having the silicide formed thereon, during the silicidation process.

Figure 3:
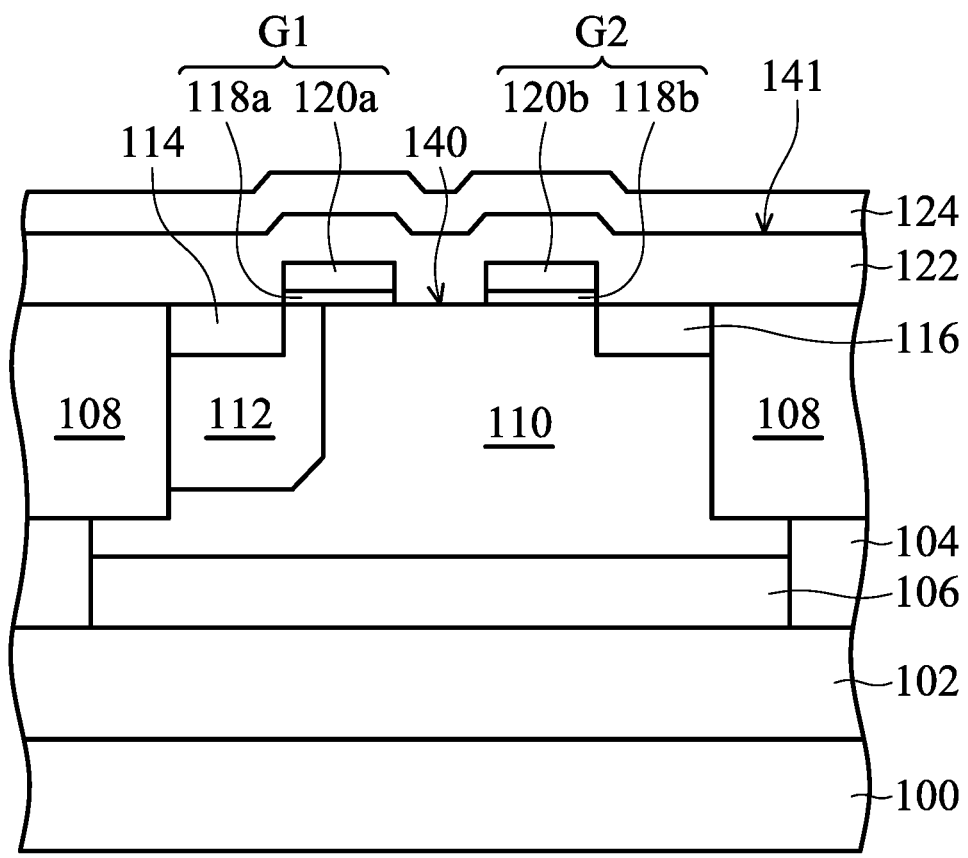

Next, a conductive layer 124 is conformably and entirely formed on the dielectric layer 122. The conductive layer 124 blanketly covers a top surface 141 of the dielectric layer 122, as shown in FIG. 3. In some embodiments, the conductive layer 124 may comprise conductive materials such as polysilicon, metal or the like, and may have a thickness of about 300-2000 Å. The conductive layer 124 may be thicker than the conductive layers 120a and 120b.

Figure 4:
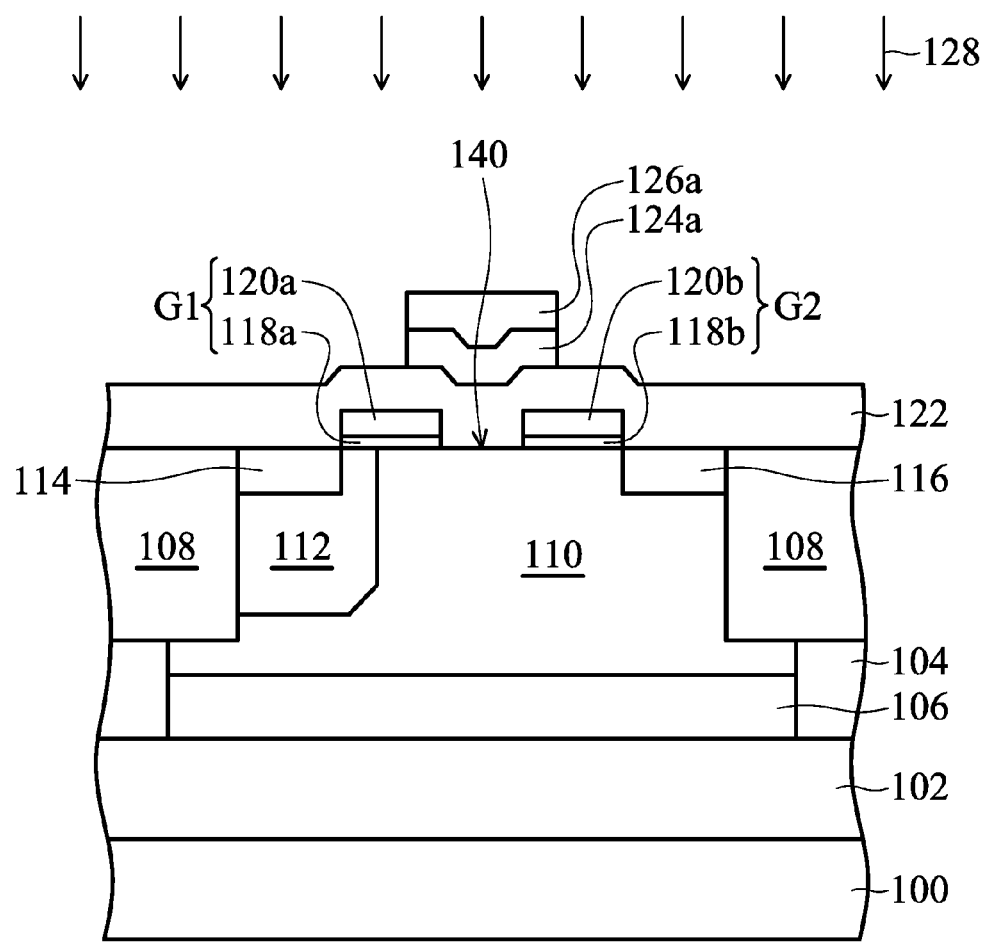

Next, a patterned mask layer 126a as shown in FIG. 4 is formed over a portion of conductive layer 124 (see FIG. 3). In some embodiments, the patterned mask layer 126a is formed by using a mask for patterning a resist-protection-oxide (RPO) layer. An etching process 128 is then performed to remove portions of the conductive layer 124 not covered by the patterned mask layer 126a. As shown in FIG. 4, the patterned mask layer 126a may comprise materials such as photoresists or the like, and the etching process 128 can be, for example, a dry etching process. The etching process 128 stops on the dielectric layer 122, thereby forming a patterned conductive layer 124a. The patterned conductive layer 124a is formed overlapping a portion of the gate structure G1, a portion of the gate structure G2. Also, the patterned conductive layer 124a is formed covering a portion of the semiconductor substrate 100 between the gate structures G1 and G2.

Figure 5:
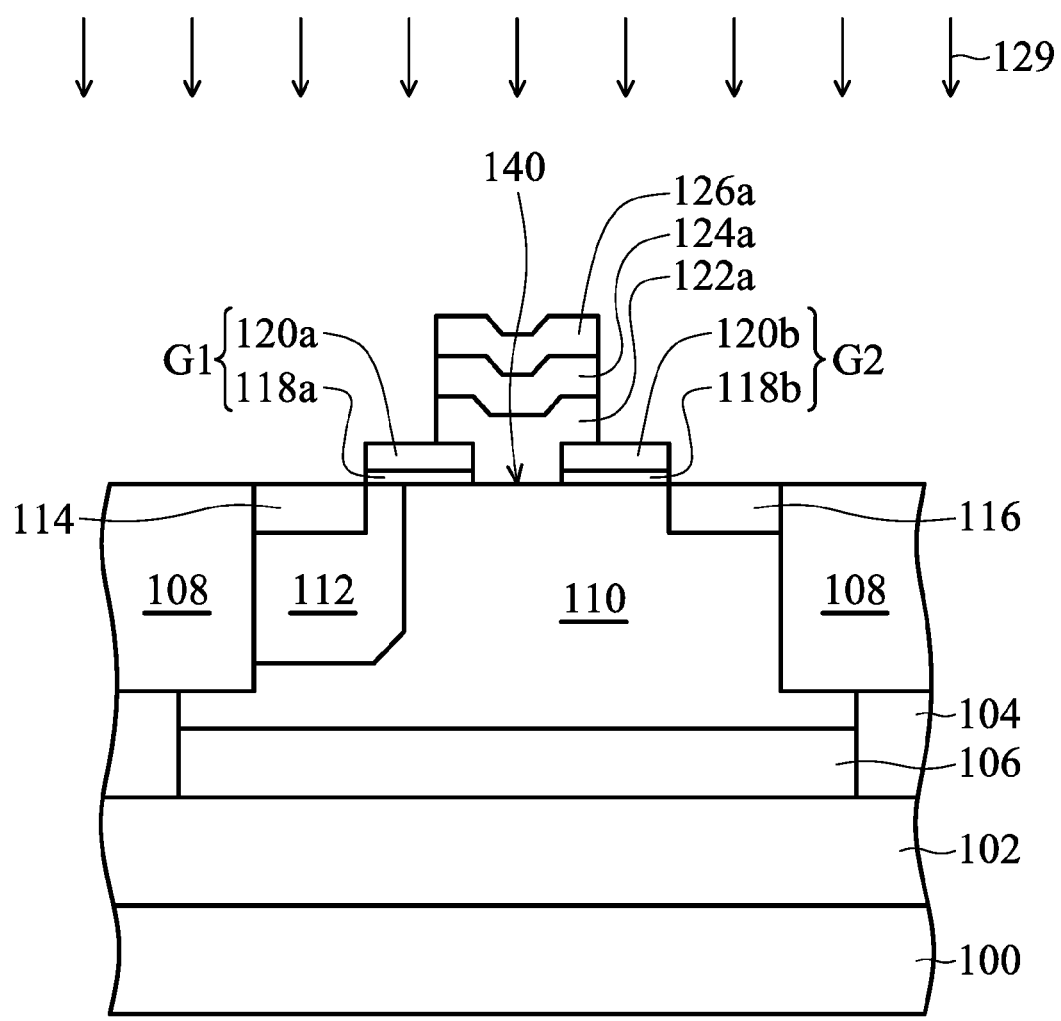

Next, another etching process 129 is performed to remove portions of the dielectric layer 122 (see FIG. 4) not covered by the patterned mask layer 126a and the patterned conductive layer 124a as shown in FIG. 5. The etching process 129 can be, for example, a dry etching process. As shown in FIG. 5, the etching process 129 stops on the conductive layer 120a and the semiconductor substrate 100, thereby respectively forming a patterned dielectric layer 122a. The patterned dielectric layer 122a is formed under the patterned conductive layer 124a. Also, the patterned dielectric layer 122a is formed over a portion of the gate structure G1, a portion of the gate structure G2 and a portion of the top surface 140 of the well doped region 110 between the gate structures G1 and G2.

Figure 6:
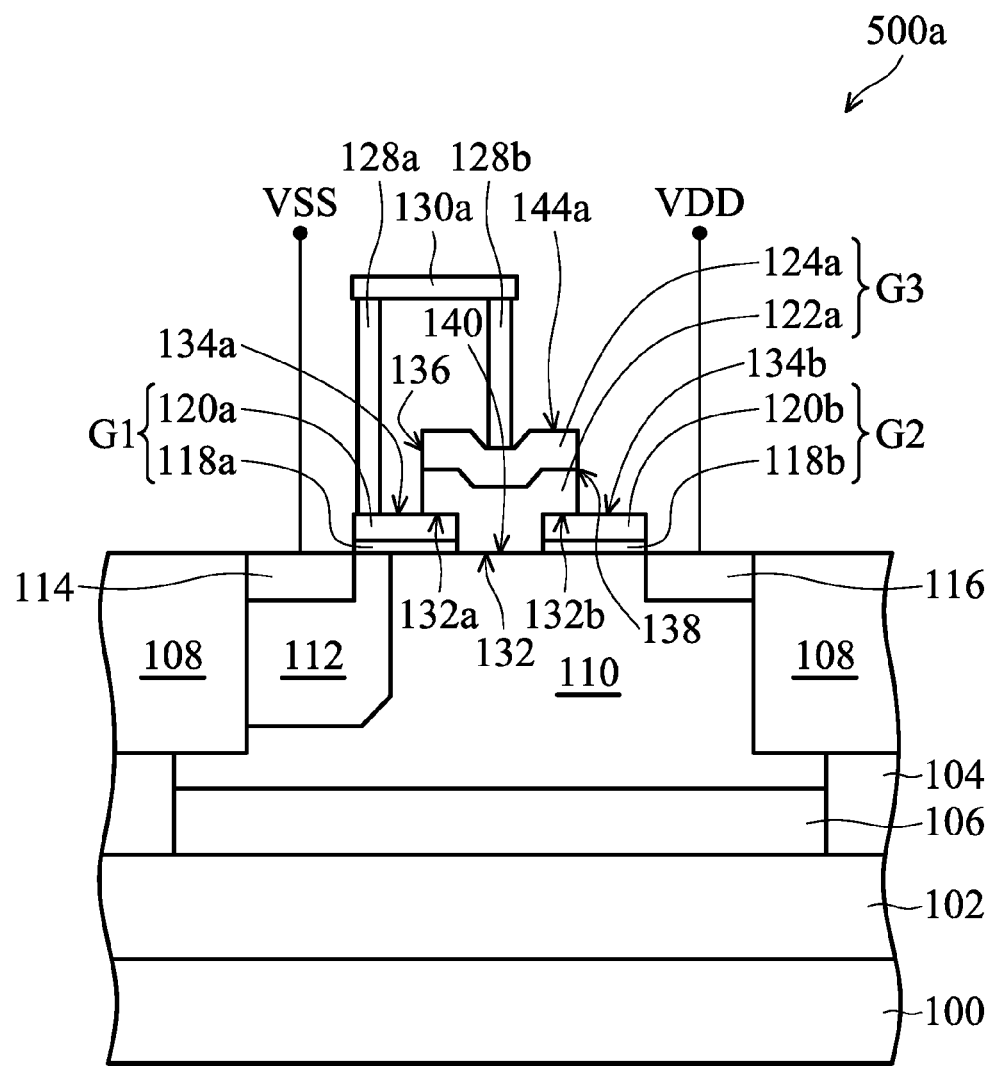

In FIG. 6, after removal the patterned mask layer 126a (shown in FIG. 5), a gate structure G3 is formed overlapping the portion of the gate structure G1, the portion of the gate structure G2 and the portion of the well doped region 110 between the gate structures G1 and G2. In some embodiments, the gate structure G3 serve as a field-plate gate structure of the semiconductor device 500a. After the aforementioned processes, the semiconductor device 500a is formed.

In some embodiments, a first portion 132a of a bottom surface 132 of the gate structure G3 is in contact with a top surface 134a of the gate structure G1. A second portion 132b of the bottom surface 132 of the gate structure G3 is in contact with a top surface 134b of the gate structure G2. The top surface 134a of the gate structure G1 is coplanar with the top surface 134b of the gate structure G2, as shown in FIG. 6. Also, the top surface 134a of the gate structure G1 and the top surface 134b of the gate structure G2 are not coplanar with a top surface 144a of the gate structure G3.

In some embodiments, the gate structure G3 comprises a first sidewall 136 and a second sidewall 138 opposite to the first sidewall 136. The first sidewall 136 is located directly on the gate structure G1, and the second sidewall 138 is located directly on the gate structure G2, as shown in FIG. 6.

In some embodiments, the gate structure G3 includes the patterned conductive layer 124a and the patterned dielectric layer 122a, as shown in FIG. 6. Therefore, a top surface 140 of the well doped region 110 between the doped region 114 and the doped region 116 (which also serves as the top surface of a channel region of the semiconductor device 500a) is entirely covered by the gate structure G1, the gate structure G2 and the gate structure G3. A patterned dielectric layer 122a of the gate structure G3 is in contact with the patterned conductive layer 118a of the gate structure G1 and the patterned conductive layer 118b of the gate structure G2.

In some embodiments, the gate structure G3 covers a portion of about 20%-80% of the top surface 134a of the underlying gate structure G1 comprising the conductive layer 120a and the dielectric layer 118a. Similarly, the gate structure G3 covers a portion of about 20%-80% of the top surface 134b of the underlying gate structure G2 comprising the conductive layer 120b and the dielectric layer 118b.

As shown in FIG. 6, for the ease of illustrating the electrical potential provided to the semiconductor device 500a, conductive contacts 128a and 128b and a conductive line 130a can be further provided to the semiconductor device 500a. The conductive contact 128a is connected to the conductive layer 120a of the gate structure G1 and the conductive contact 128b is connected to the conductive layer 124a of the gate structure G3. In some embodiments, the conductive contacts 128a and 128b are both connected the conductive line 130a, so that the gate structure G3 is electrically coupled to the gate structure G1. The gate structure G3 comprising the patterned conductive layer 124a and the patterned dielectric layer 122a and the gate structure G1 comprising the conductive layer 120a and the dielectric layer 118a may be provided with the same electrical potential during operations. Therefore, the gate structure G1 and the gate structure G3 may serve as a combined gate structure to increase the on-state current of the semiconductor device.

In some other embodiments, the gate structure G3 is electrically coupled to the doped region 114 (i.e. the source doped region of the semiconductor device 500a) rather than to the gate structure G1. In other words, the gate structure G3 is electrically coupled to the reference potential VSS to increase the switching speed of the semiconductor device.

In some embodiments, the conductive contacts 128a and 128b may comprise conductive materials such as tungsten, copper or the like, and the conductive line 130a may comprise materials such as tungsten, copper or the like.

In some embodiments, the gate structure G2 is electrically floating. Therefore, the gate structure G2 may serve as a dummy gate structure. Also, the doped region 114, which serves as the source doped region of the semiconductor device 500a, is electrically coupled to a reference potential VSS. The doped region 116, which serves as the drain doped region of the semiconductor device 500a, is electrically coupled to a drain supply voltage VDD.

As shown in FIG. 6, the gate structure G3 may serve as a field plate gate structure. In some embodiments, the gate structure G3, which comprises the patterned conductive layer 124a and the patterned dielectric layer 122a, and the gate structure G1, which comprises the conductive layer 120a and the dielectric layer 118a, may be combined to function as a combined gate structure of the semiconductor device 500a capable of high-voltage operations. Therefore, the gate structure G3 may serve as an extended gate structure to reduce the surface electric field and to increase the on-state current of the semiconductor device 500a. In some other embodiments, the gate structure G3 is electrically coupled to the doped region 114 to increase the switching speed of the semiconductor device 500a. The doped region 114 and the doped region 116 may function as source doped region and drain doped region, respectively.

In this embodiment, the gate structure G3 is pulled away from the doped region 116 (the drain doped region) by the gate structure G2 to improve the breakdown voltage of the of the semiconductor device 500a. Also, the gate structure G2 is formed to prevent the undesired silicide from being formed on the channel region between the gate structure G1 and the doped region 116.

Figure 7:
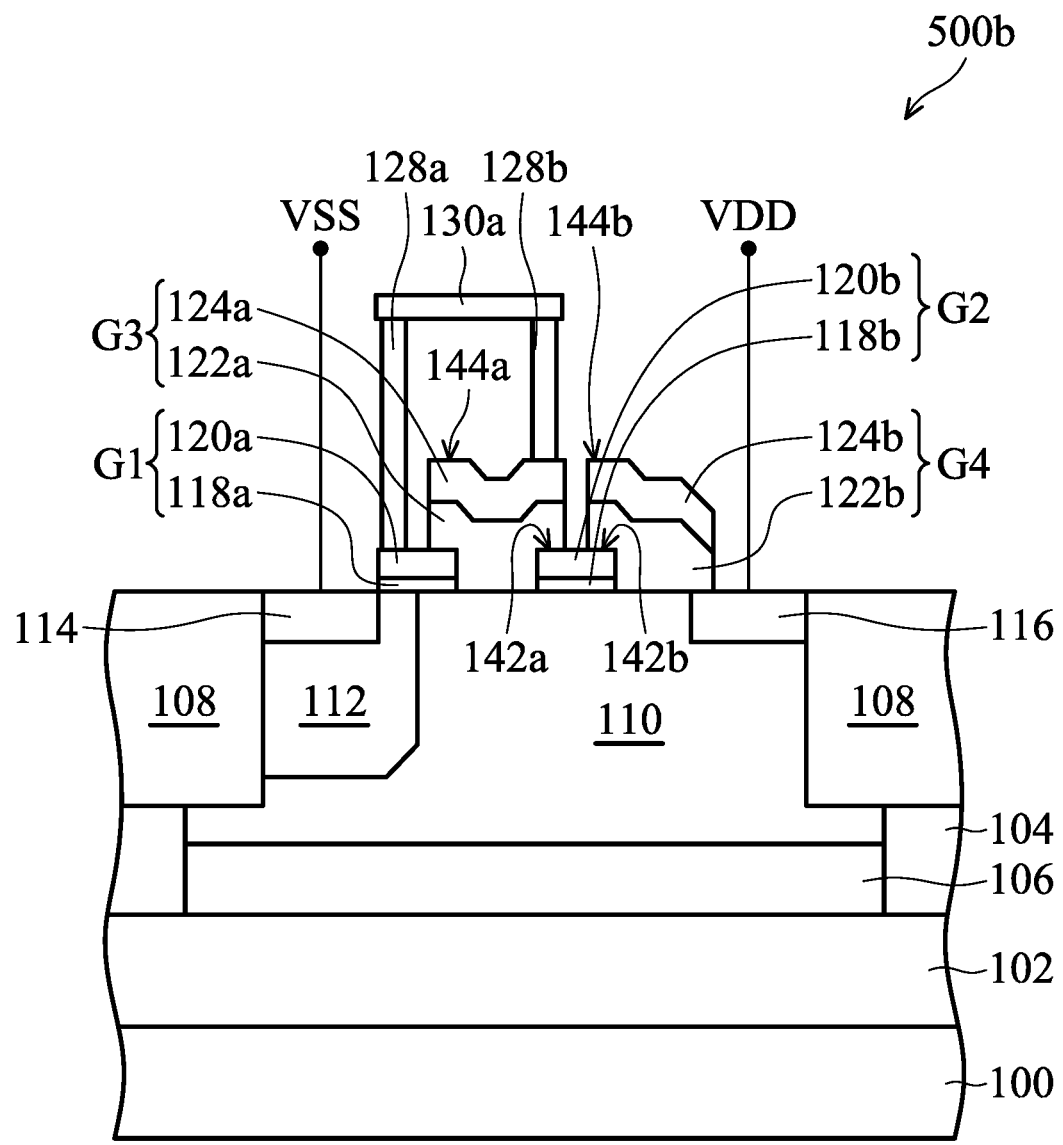
FIG. 7 is a cross-sectional view of a semiconductor device in accordance with some embodiments of the disclosure.

FIG. 7 is a cross-sectional view of a semiconductor device 500b in accordance with some embodiments of the disclosure. Elements of the embodiments hereinafter that are the same or similar as those previously described with reference to FIGS. 1-6, are not repeated for brevity. One of the differences between the semiconductor device 500a and the semiconductor device 500b is that the semiconductor device 500b further includes a gate structure G4 formed beside the gate structure G3 close to the doped region 116. The gate structure G4 also covers a portion 142b of the gate structure G2 and a portion of the top surface 140 of the well doped region 110 between the gate structure G2 and the doped region 116. Therefore, the top surface 140 of the well doped region 110 between the doped region 114 and the doped region 116 (which also serves as the top surface of a channel region of the semiconductor device 500b) is entirely covered by the gate structure G1, the gate structure G2, the gate structure G3 and the gate structure G4. The gate structure G3, which is electrically coupled to the gate structure G1, is pulled away from the doped region 116 by the formation of the gate structure G2 and the gate structure G4.

In some other embodiments, the gate structure G4 may be formed overlapping a portion of the doped region 116. Also, the gate structure G3 overlaps a first portion 142a of the gate structure G2. The gate structure G4 overlaps a second portion 142b of the gate structure G2, which is different from the first portion 142a.

As shown in FIG. 7, the gate structure G4 includes a patterned conductive layer 124b and a patterned dielectric layer 122b. The patterned dielectric layer 122b is formed by patterning the dielectric layer 122 through the etching process 128. Similarly, the patterned conductive layer 124b is also formed by patterning the conductive layer 124 through the etching process 128. In other words, the patterned dielectric layers 122a and 122b are formed simultaneously. The patterned conductive layers 142a and 124b are formed simultaneously. Therefore, the gate structure G4 also serves as a field plate gate structure. A top surface 144a of the gate structure G3 is aligned to a top surface 144b of the gate structure G4.

In some embodiments, the gate structure G2 and gate structure G4 are electrically floating. Therefore, the gate structure G2 and gate structure G4 both serve as dummy gate structures. In some embodiments, the gate structure G3 is electrically coupled to the gate structure G1 through the conductive contacts 128a and 128b and the conductive line 130a to increase the on-state current of the semiconductor device 500b. In some other embodiments, the gate structure G3 is electrically coupled to the doped region 114 through the conductive contact (not shown) to increase the switching speed of the semiconductor device 500b. Also, the doped region 114, which serves as the source doped region of the semiconductor device 500b, is electrically coupled to the reference potential VSS. The doped region 116, which serves as the drain doped region of the semiconductor device 500b, is electrically coupled to the drain supply voltage VDD.

In this embodiment, the gate structure G3 is pulled away from the doped region 116 (the drain doped region) by the gate structure G2 and the gate structure G4, which serve as dummy gate structures, to improve the breakdown voltage of the of the semiconductor device 500b. Also, the gate structure G2 and the gate structure G4 are formed to prevent the undesired silicide from forming on the channel region between the gate structure G3 and the doped region 116.

Figure 8:
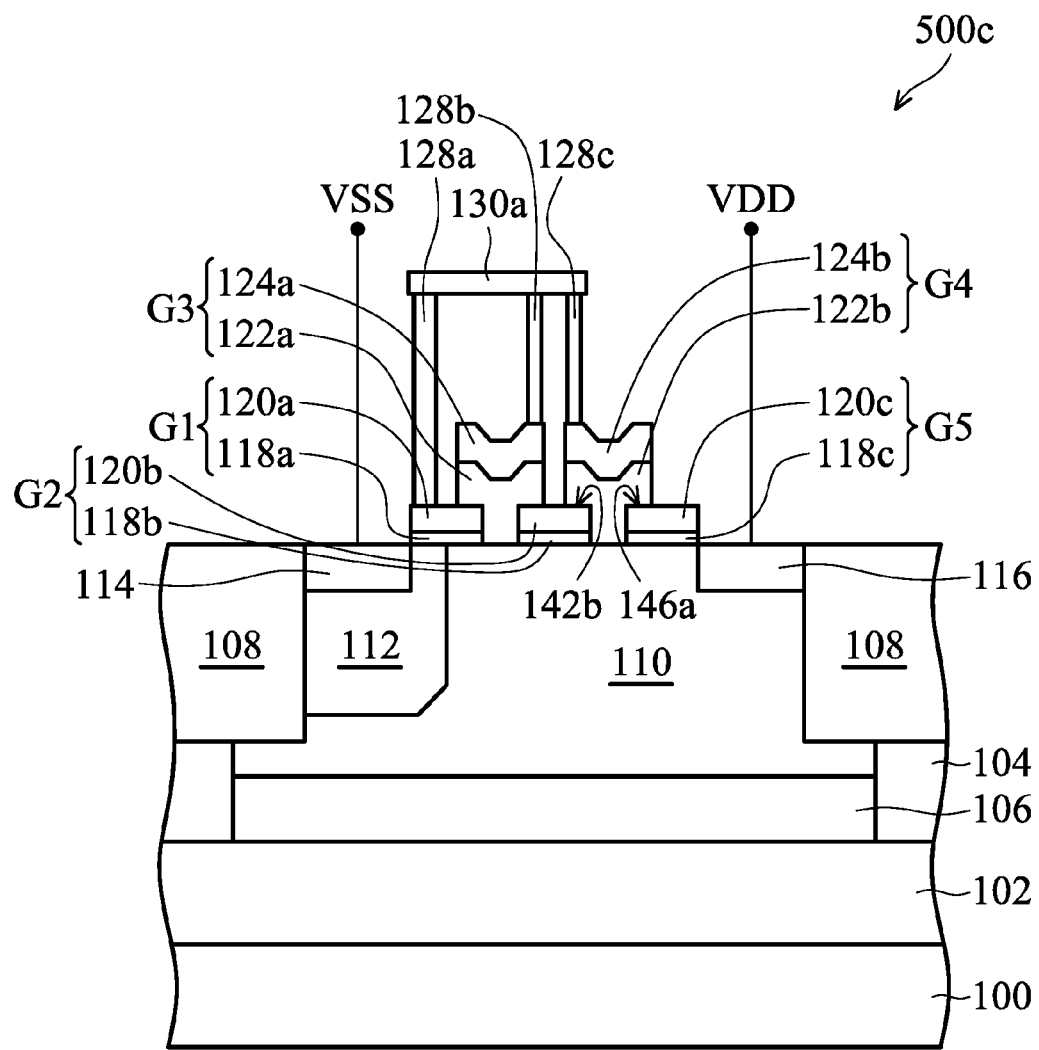
FIG. 8 is a cross-sectional view of a semiconductor device in accordance with some embodiments of the disclosure.

FIG. 8 is a cross-sectional view of a semiconductor device 500c in accordance with some embodiments of the disclosure. Elements of the embodiments hereinafter that are the same or similar as those previously described with reference to FIGS. 1-7, are not repeated for brevity. One of the differences between the semiconductor device 500c and the semiconductor device 500b (FIG. 7) is that the semiconductor device 500c further includes a gate structure G5 formed beside the gate structure G2 and adjacent to the doped region 116. The gate structure G5 is formed on the top surface 140 of the well doped region 110 between the gate structure G2 and the doped region 116. The gate structure G4 overlaps both the portion 142b of the gate structure G2 and a portion 146a of the gate structure G5. Therefore, the top surface 140 of the well doped region 110 between the doped region 114 and the doped region 116 (which also serves as the top surface of a channel region of the semiconductor device 500c) is entirely covered by the gate structure G1, the gate structure G2, the gate structure G3, the gate structure G4 and the gate structure G5.

In some embodiments, the gate structure G4 covers the portion 142b of about 20%-80% of the top surface of the underlying gate structure G2 comprising the conductive layer 120b and the dielectric layer 118b. Similarly, the gate structure G4 covers the portion 146a of about 20%-80% of the top surface of the underlying gate structure G5 comprising the conductive layer 120c and the dielectric layer 118c.

As shown in FIG. 8, the gate structure G5 includes a dielectric layer 118c and a conductive layer 120c on the dielectric layer 118c. The dielectric layers 118a, 118b and 118c are formed simultaneously. Also, the conductive layers 120a, 120b and 120c are formed simultaneously. Therefore, the top surface of gate structure G5 is coplanar with the top surface 134a of the gate structure G1 and the top surface 134b of the gate structure G2.

As shown in FIG. 8, the gate structure G4 may serve as a field plate gate structure. In some embodiments, the gate structure G4 is electrically coupled to the gate structure G1 and the gate structure G3 through the conductive contacts 128a, 128b and 128c and the conductive line 130a. The gate structure G1, the gate structure G3 and the gate structure G4 may be collectively combined to function as a combined gate structure of the semiconductor device 500c capable of high-voltage operations. Therefore, the gate structure G3 and the gate structure G4 may serve as extended gate structures to increase the on-state current of the semiconductor device 500c. In some other embodiments, the gate structure G3 and the gate structure G4 are electrically coupled to the doped region 114 through the conductive contact (not shown) to increase the switching speed of the semiconductor device 500c.

In some embodiments, the gate structure G2 and gate structure G5 are electrically floating. Therefore, the gate structure G2 and gate structure G5 may serve as dummy gate structures. Also, the doped region 114, which serves as the source doped region of the semiconductor device 500c, is electrically coupled to the reference potential VSS. The doped region 116, which serves as the drain doped region of the semiconductor device 500c, is electrically coupled to the drain supply voltage VDD.

In this embodiment, the gate structure G4 is pulled away from the doped region 116 (the drain doped region) by the formation of the gate structure G5, which serve as dummy gate structures, to improve the breakdown voltage of the of the semiconductor device 500c. Also, the gate structure G5 is formed to prevent the undesired silicide from forming on the channel region between the gate structure G4 and the doped region 116.

Embodiments provide semiconductor devices 500a-500c. Through the use of the combined gate structure shown in FIGS. 6-8, a more uniform electric field contribution can be observed in the portion of the well doped region 110 underlying the combined gate structure during the operation of the semiconductor devices 500a-500c shown in FIGS. 6-8 when compared with another semiconductor device that is similar to the one shown in FIG. 6, but which comprises only the gate structure G1 comprising a conductive layer 120a and a dielectric layer 118a and a dielectric layer 122. Also, the combined gate structure is pulled away from the drain doped region by the formation of the dummy gate structure to improve the breakdown voltage of the of the semiconductor device. The dummy gate structure is formed to prevent the undesired silicide from being formed on the channel region between the combined gate structure and the drain doped region of the semiconductor device. Accordingly, the semiconductor devices 500a-500c capable of high-voltage operation shown in FIGS. 6-8 can operate at a higher voltage of about 9-100 volts, which is about 100-1100% higher than a semiconductor device that is similar to the one shown in FIG. 6, but which comprises only the gate structure G1 comprising a conductive layer 120a and a dielectric layer 118a and a dielectric layer 122.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a semiconductor substrate having a first conductivity type;
    a first well doped region formed in a portion of the semiconductor substrate, having a second conductivity type that is the opposite of the first conductivity type;
    a source doped region formed on the first well doped region, having the second conductivity type;
    a drain doped region formed on the first well doped region and separated from the source doped region, having the second conductivity type;
    a first gate structure formed over the first well doped region and adjacent to the source doped region;
    a second gate structure formed beside the first gate structure and close to the drain doped region; and
    a third gate structure formed overlapping a portion of the first gate structure and a first portion of the second gate structure.

2. The semiconductor device as claimed in claim 1, wherein a top surface of the first well doped region between the source doped region and the drain doped region is entirely covered by the first gate structure, the second gate structure and the third gate structure.

3. The semiconductor device as claimed in claim 1, further comprising:
    a second well doped region formed in a portion of the first well doped region, having the first conductivity type, wherein the source doped region is formed on a portion of the second well doped region, and
    wherein the first gate structure is formed overlapping both a portion of the second well doped region and a portion of the first well doped region.

4. The semiconductor device as claimed in claim 1, wherein a third dielectric layer of the third gate structure is in contact with a first conductive layer of the first gate structure and a second conductive layer of the second gate structure.

5. The semiconductor device as claimed in claim 1, wherein the third gate structure is electrically coupled to the first gate structure.

6. The semiconductor device as claimed in claim 1, wherein the second gate structure is electrically floating, wherein the source doped region is electrically coupled to a reference potential (VSS), and wherein the drain doped region is electrically coupled to a drain supply voltage (VDD).

7. The semiconductor device as claimed in claim 1, wherein a first distance between the source doped region and the drain doped region is greater than a second distance between the first gate structure and the second gate structure.

8. The semiconductor device as claimed in claim 1, further comprising:
    a fourth gate structure formed beside the third gate structure and close to the second doped region,
    wherein the fourth gate structure overlaps a second portion of the second gate structure, which is different from the first portion of the second gate structure.

9. The semiconductor device as claimed in claim 8, wherein the fourth gate structure is electrically floating.

10. The semiconductor device as claimed in claim 8, wherein a top surface of the third gate structure is aligned to a top surface of the fourth gate structure.

11. The semiconductor device as claimed in claim 8, further comprising:
    a fifth gate structure formed beside the second gate structure and adjacent to the second doped region,
    wherein the fourth gate structure overlaps both the third gate structure and the fifth gate structure.

12. The semiconductor device as claimed in claim 11, wherein the fourth gate structure is electrically coupled to the first gate structure and the third gate structure, and wherein the fifth gate structure is electrically floating.

13. A semiconductor device, comprising:
    a semiconductor substrate having a first conductivity type;
    a first well doped region formed in a portion of the semiconductor substrate, having a second conductivity type that is the opposite of the first conductivity type;
    a source doped region formed on the first well doped region, having the second conductivity type;
    a drain doped region formed on a portion of the first well doped region and separated from the source doped region, having the second conductivity type;
    a first gate structure formed on the first well doped region and close to the source doped region;
    a second gate structure positioned close to the drain doped region and separated from the first gate structure; and
    a third gate structure covering the first gate structure and the second gate structure, wherein
    a first portion of a bottom surface of the third gate structure is in contact with a top surface of the first gate structure, and a second portion of the bottom surface of the third gate structure is in contact with a top surface of the second gate structure.

14. The semiconductor device as claimed in claim 13, wherein the top surface of the first gate structure is coplanar with the top surface of the second gate structure.

15. The semiconductor device as claimed in claim 13, wherein the third gate structure comprises a first sidewall and a second sidewall opposite to the first sidewall, wherein the first sidewall is located directly on the first gate structure, and wherein the second sidewall is located directly on the second gate structure.

16. The semiconductor device as claimed in claim 13, wherein a top surface of the first well doped region between the source doped region and the drain doped region is entirely covered by the first gate structure, the second gate structure and the third gate structure.

17. The semiconductor device as claimed in claim 13, wherein:
the third gate structure is electrically coupled to the first gate structure;
the second gate structure is electrically floating;
the source doped region is electrically coupled to a reference potential (VSS); and
the drain doped region is electrically coupled to a drain supply voltage (VDD).

18. The semiconductor device as claimed in claim 13, further comprising:
a fourth gate structure covering a portion of the second gate structure and a top surface of the first well doped region between the second gate structure and the second doped region,
wherein a top surface of the third gate structure is aligned to a top surface of the fourth gate structure.

19. The semiconductor device as claimed in claim 18, wherein:
the third gate structure is electrically coupled to the first gate structure;
and the second gate structure and the fourth gate structure are electrically floating;
the first doped region is electrically coupled to a reference potential (VSS); and
the second doped region is electrically coupled to a drain supply voltage (VDD).

20. The semiconductor device as claimed in claim 18, further comprising:
a fifth gate structure formed on the top surface of the first well doped region between the second gate structure and the second doped region,
wherein the fourth gate structure covers a portion of the fifth gate structure.

21. The semiconductor device as claimed in claim 13, wherein:
the fourth gate structure is electrically coupled to the first gate structure and the third gate structure;
the second gate structure and the fifth gate structure are electrically floating;

the first doped region is electrically coupled to the reference potential (VSS); and
the second doped region is electrically coupled to a drain supply voltage (VDD).

22. A semiconductor device, comprising:
a semiconductor substrate having a first conductivity type;
a first well doped region formed in a portion of the semiconductor substrate, having a second conductivity type that is the opposite of the first conductivity type;
a source doped region formed on the first well doped region, having the second conductivity type;
a drain doped region formed on the first well doped region and separated from the source doped region, having the second conductivity type;
a gate structure formed on the first well doped region close to the source doped region;
a first extended gate structure formed covering and electrically coupled to the gate structure and formed over the first well doped region; and
a first dummy gate structure covering the first well doped region between the first extended gate structure and the drain doped region, so that the first extended gate structure is spaced from the drain doped region by the dummy gate structure.

23. The semiconductor device as claimed in claim 22, wherein a top surface of the gate structure is coplanar with a top surface of the first dummy gate structure, but is not coplanar with a top surface of the first extended gate structure.

24. The semiconductor device as claimed in claim 22, further comprising:
a second extended gate structure covering a portion of the first dummy gate structure and the first well doped region between the first dummy gate and the drain doped region,
wherein a top surface of the first extended gate structure is aligned to a top surface of the second extended gate structure.

25. The semiconductor device as claimed in claim 24, further comprising:
a second dummy gate structure formed between the first dummy gate structure and the second doped region and covered by the second extended gate structure,
wherein the gate structure is electrically coupled to the first extended gate structure and the second extended gate structure.

* * * * *